United States Patent [19]
Seiki et al.

[11] Patent Number: 5,811,835
[45] Date of Patent: Sep. 22, 1998

[54] THIN-FILM TRANSISTOR WITH EDGE INCLINED GATES AND LIQUID CRYSTAL DISPLAY DEVICE FURNISHED WITH THE SAME

[75] Inventors: Masahiro Seiki, Yokohama; Akira Kubo, Himeji, both of Japan

[73] Assignee: Kabushiki Kaisha Toshiba, Kawasaki, Japan

[21] Appl. No.: 701,464

[22] Filed: Aug. 22, 1996

[30] Foreign Application Priority Data

Aug. 23, 1995 [JP] Japan .................................. 7-214357

[51] Int. Cl.$^6$ .................................................. H01L 27/01
[52] U.S. Cl. ............................... 257/57; 257/59; 257/66; 257/72; 349/41; 349/42; 349/43
[58] Field of Search .................................. 257/57, 59, 66, 257/72, 350, 351, 354, 357, 365–369; 349/41–43

[56] References Cited

U.S. PATENT DOCUMENTS 5,243,202  9/1993  Mori et al. ................................. 257/59
5,334,860  8/1994  Naito ........................................ 257/59

FOREIGN PATENT DOCUMENTS 4-353830  12/1992  Japan .
4-372934  12/1992  Japan .
5-152572   1/1993  Japan .
6-120503   4/1994  Japan .

*Primary Examiner*—Tom Thomas
*Assistant Examiner*—Fetsum Abraham
*Attorney, Agent, or Firm*—Cushman Darby & Cushman IP Group of Pillsbury Madison & Sutro LLP

[57] ABSTRACT

An array substrate of a liquid crystal display device has a glass substrate on which gate lines, signal lines, pixel electrodes, and thin-film transistors are arranged. Each of the thin-film transistors includes a gate electrode composed of a part of one of the gate lines and including a first conductive layer formed on the glass substrate and a second conductive layer covering the first conductive layer. A gate insulating film is formed on the glass substrate and covers the gate electrode. A thin non-single-crystal silicon film is disposed on the gate insulating film on the gate electrode and includes a channel region. Source and drain electrodes are connected electrically to the thin non-single-crystal silicon film. The first conductive layer has two opposite side edge portions extending inclined at an angle to the surface of the substrate, the inclination angle of each side edge portion is ranges from 10° to 30°, so that the thin non-single-crystal silicon film has a continuous interface without bends, situated on the side of the gate insulating film in the channel region.

10 Claims, 5 Drawing Sheets

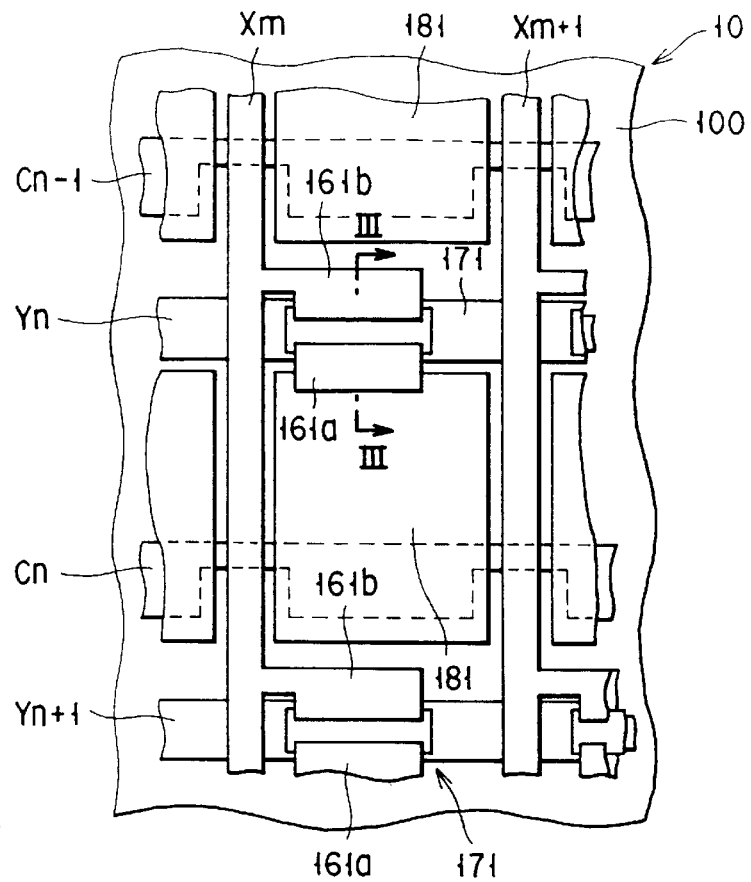
F I G. 1
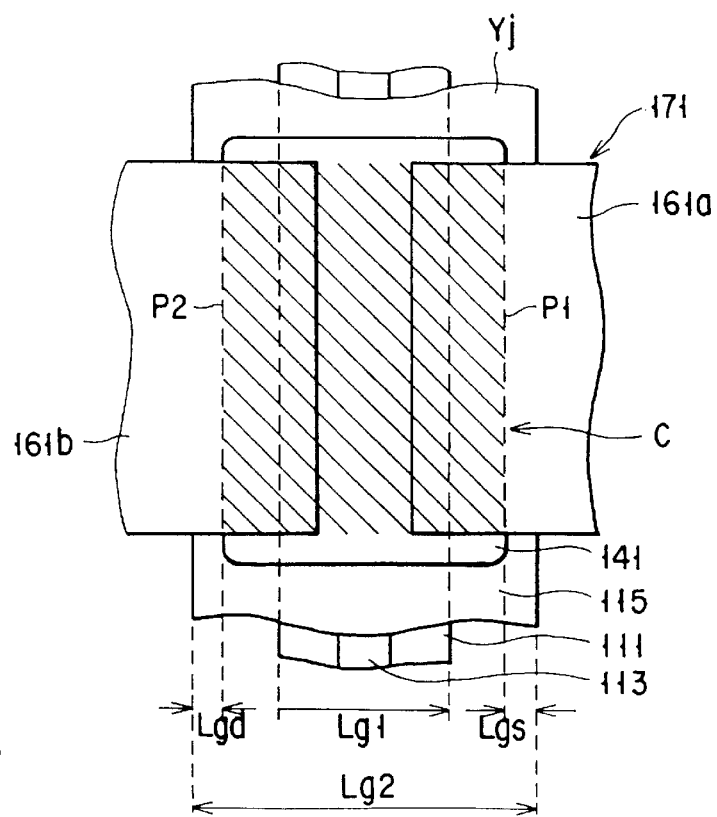
F I G. 2

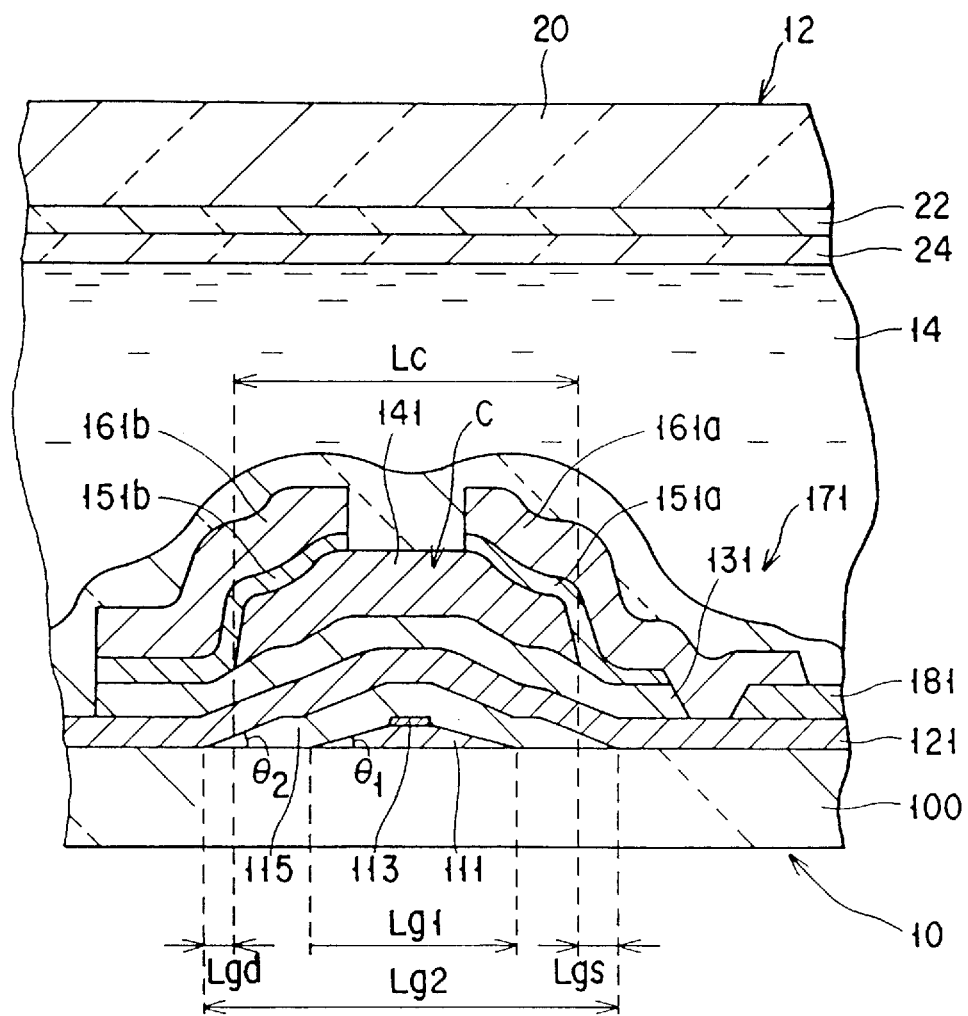
F I G. 3

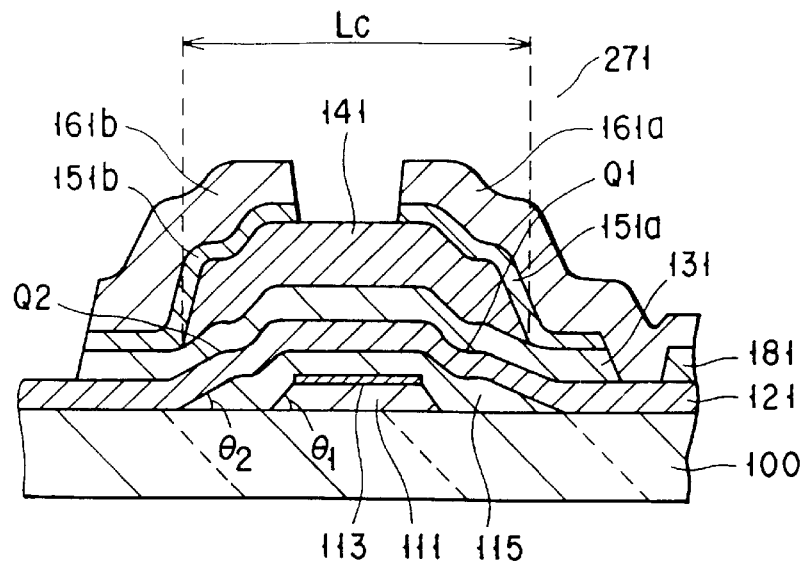
F I G. 4
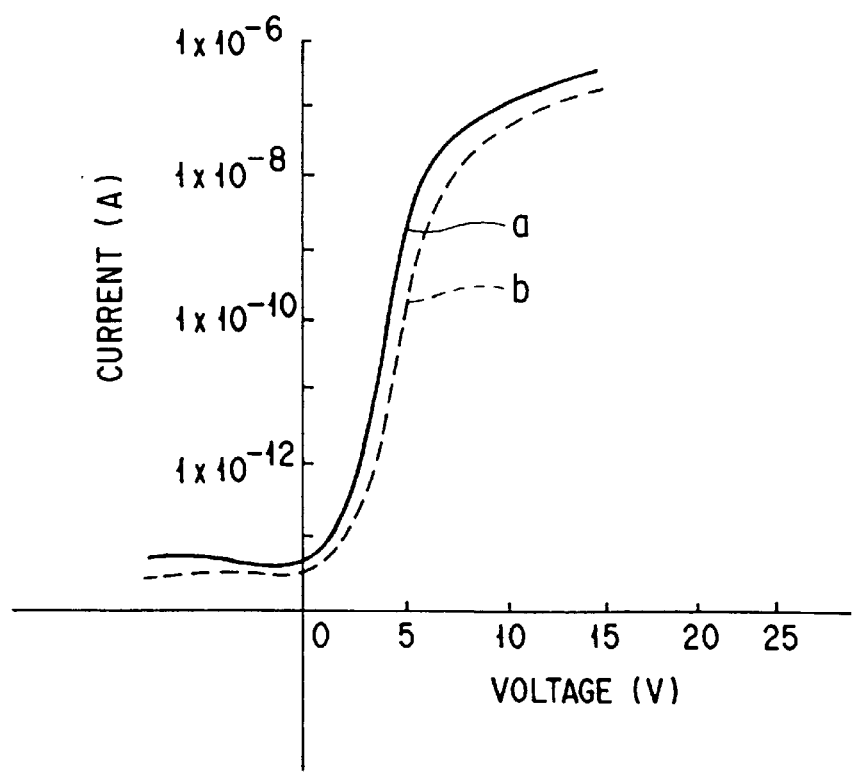
F I G. 5

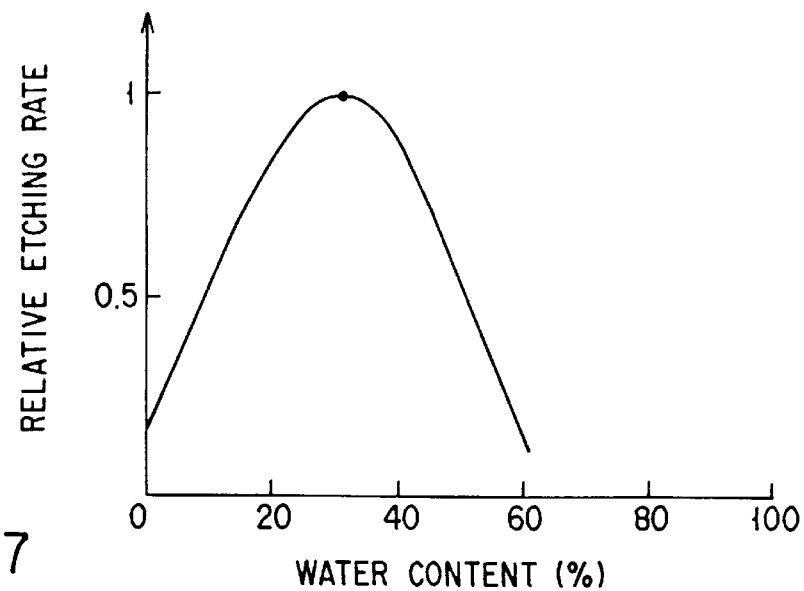
F I G. 7
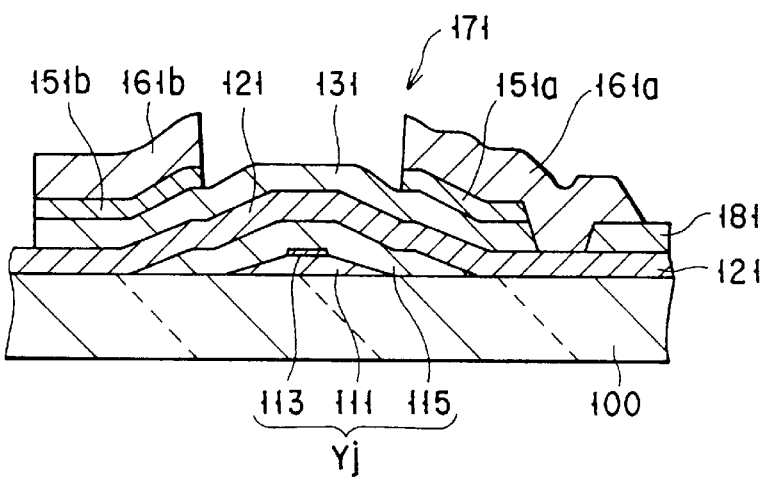
F I G. 8
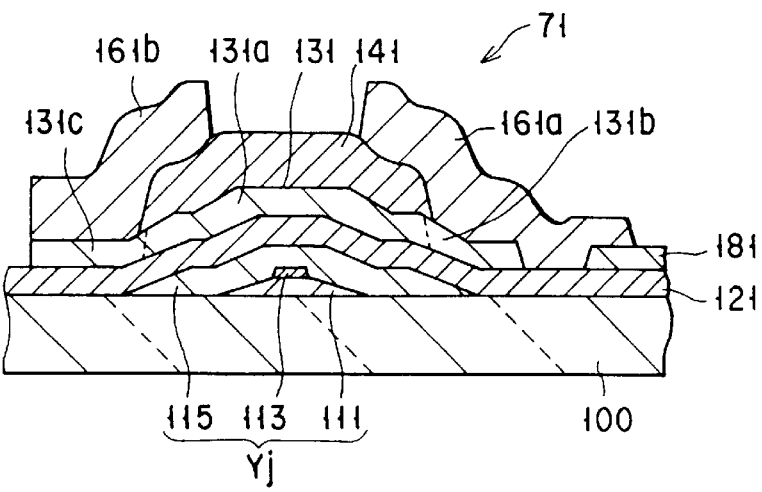
F I G. 9

THIN-FILM TRANSISTOR WITH EDGE INCLINED GATES AND LIQUID CRYSTAL DISPLAY DEVICE FURNISHED WITH THE SAME

BACKGROUND OF THE INVENTION

1. Field of the Invention

The present invention relates to a thin-film transistor (hereinafter referred to as TFT), formed of a non-single-crystal silicon film disposed on an insulating substrate, and a liquid crystal display device furnished with the same.

2. Description of the Related Art

Since those TFTs which use a thin non-single-crystal silicon film, such as an amorphous silicon (hereinafter referred to as a-Si:H) or polycrystalline silicon (hereinafter referred to as p-Si) film, can be formed uniformly on an insulating substrate, covering a relatively wide area, they are conventionally used in pixel switches, driver circuits, etc. of active-matrix liquid crystal display devices.

In the case where one such TFT is used as a pixel switch of an active-matrix liquid crystal display device, the electrical resistance of a gate electrode of the TFT must be lowered in order to lessen waveform distortion. Gate electrodes that meet this requirement are described in Jpn. Pat. Appln. KOKAI Publication Nos. 4-353830, 5-152572, and 6-120503. These gate electrodes are composed of a low-resistance metal, such as aluminum (Al), coated with chromium (Cr), tungsten (W), titanium (Ti), tantalum (Ta), or some other metal whose melting point is higher than that of aluminum or with an aluminum alloy so that a hillock, blister, etc. of aluminum can be effectively prevented.

In Jpn. Pat. Appln. KOKAI Publication No. 4-372934, the inventors hereof proposed a method in which molybdenum (Mo) is deposited on an aluminum film, etched with use of a mixed acid, and then removed so that the aluminum film is tapered taking advantage of the difference in etching rate, in forming a gate electrode of a laminated structure from aluminum and some other metallic material, e.g., a molybdenum-tantalum (Mo-Ta) alloy, covering the aluminum film. According to this method, an insulating film on the gate electrode can be prevented from suffering insulation failure.

In order to enjoy excellent element characteristics, it is advisable to enhance the mobility of the TFT and lower its threshold voltage ($V_{th}$), in view of the operating efficiency. With the gate electrode multilayered to lower its electrical resistance, however, the TFT has a tendency to exhibit low mobility and high threshold voltage.

SUMMARY OF THE INVENTION

The present invention has been contrived in consideration of these circumstances, and its object is to provide a thin-film transistor, of which the electrical resistance of a gate electrode can be lowered without increasing element failure and excellent element characteristics can be enjoyed, and a liquid crystal display device furnished with the same.

The inventors hereof found that the element characteristics of a TFT depend on the configuration of the interface of a thin non-single-crystal silicon film on the side of a gate insulating film in a channel region, and attained the present invention.

A TFT according to the present invention comprises a gate electrode including a first conductive layer formed on a substrate and a second conductive layer covering the first conductive layer, a gate insulating film formed on the substrate and covering the gate electrode, a thin non-single-crystal silicon film disposed on the gate insulating film on the gate electrode and including a channel region, and a source electrode and a drain electrode connected electrically to the thin non-single-crystal silicon film. The thin non-single-crystal silicon film has a continuous interface without bends, situated on the side of the gate insulating film in the channel region.

A liquid crystal display device according to the present invention comprises an array substrate and an opposite substrate facing each other with a liquid crystal layer between them. The array substrate includes a glass substrate, a plurality of gate lines formed on a principal surface of the glass substrate and extending parallel to one another, a plurality of signal lines arranged on the principal surface of the glass substrate and extending parallel to one another and substantially at right angles to the gate lines, pixel electrodes arranged individually in regions defined by the gate lines and the signal lines, and thin-film transistors provided individually at the intersections of the gate lines and the signal lines.

Each of the thin-film transistors includes a gate electrode formed of a part of one of the gate wires and including a first conductive layer formed on the glass substrate and a second conductive layer covering the first conductive layer, a gate insulating film formed on the glass substrate and covering the gate electrode, a thin non-single-crystal silicon film disposed on the gate insulating film on the gate electrode and including a channel region, and a source electrode and a drain electrode connected electrically to the thin non-single-crystal silicon film.

The thin non-single-crystal silicon film has a continuous interface without bends, situated on the side of the gate insulating film in the channel region.

According to the present invention, the gate electrode of the TFT includes at least the first conductive layer and the second conductive layer covering the same, whereby its electrical resistance is lowered, a hillock or blister is prevented, and the resistance to chemicals is improved.

The inventors hereof investigated changes of the element characteristics of the TFT, which are attributable to differences in the configuration of the principal surfaces of electrodes within the channel region, and found that the element characteristics, especially the mobility and threshold voltage ($V_{TH}$), change depending on whether or not the interface of the thin non-single-crystal silicon film on the side of the gate insulating film in the channel region is a continuous interface without bends.

Thus, the TFT of the present invention is characterized in that the interface of the thin non-single-crystal silicon film on the side of the gate insulating film in the channel region is formed continuously without involving bends.

If the interface of the thin non-single-crystal silicon film on the side of the gate insulating film is an irregular interface that contains substantial bends, the potential barrier is believed to heighten at the bends, so that the mobility of the TFT is lowered, and the threshold voltage ($V_{TH}$) is increased.

According to the TFT of the present invention, therefore, the interface of the thin non-single-crystal silicon film on the side of the gate insulating film in the channel region is a continuous interface containing no substantial bends, that is, a smooth interface, so that the potential barrier can be prevented from heightening, and high mobility and low threshold voltage ($V_{TH}$) can be enjoyed.

The interface according to the invention may be obtained by a method in which the gate insulating film is made thick enough to lessen the influence of the difference in level of the principal surfaces of the gate electrodes, a method in which the second conductive layer is made thick enough, or a method in which the angle between each side wall of the first conductive layer, which constitutes each gate electrode, and the principal surface of the substrate, that is, an inclination angle ($\theta_1$), is set at a value smaller enough than a value for a measure to counter insulation failure.

The inventors hereof confirmed that substantial bends can be effectively prevented from existing in the interface of the thin non-single-crystal silicon film on the side of the gate insulating film in the channel region, without changing the thickness or material of the gate insulating film, by setting the inclination angle ($\theta_1$) of the first conductive layer within the range of 10° to 30°.

Insulation failure of the gate insulating film between the gate electrodes and the thin non-single-crystal silicon film can be substantially removed by properly inclining both side edge portions of the first conductive layer, which constitutes the gate electrode, and more specifically, by setting the inclination angle ($\theta_1$) at 40° or thereabout, as described in Jpn. Pat. Appln. KOKAI Publication No. 4-372934. In order to improve the element characteristics, however, it is advisable to set the inclination angle ($\theta_1$) narrower than 40°, and preferably within the range of 10° to 30°. If the inclination angle ($\theta_1$) of the first conductive layer is narrower than 10°, the line width of the gate electrode cannot be controlled with ease, and the characteristics of the elements are liable to variations.

The first conductive layer may be formed of a metal or alloy based mainly on at least one of the materials selected from the group including aluminum (Al), copper (Cu), and alpha tantalum ($\alpha$-Ta) such as aluminum-neodymium alloy, or aluminum-indium alloy. Aluminum is preferred in particular, since low-resistance lines can be formed from its thin film. In the case where the first conductive layer is formed of aluminum, its thickness should preferably range from 100 to 300 nm, depending on the required line resistance.

The second conductive layer may be formed of a metal or alloy based mainly on at least one of the materials selected from the group including tantalum (Ta), tungsten (W), and molybdenum (Mo). In consideration of the prevention of a hillock or blister of the first conductive layer and the resistance to chemicals, as well as electrical resistance, in particular, a molybdenum-tungsten (Mo-W) alloy, molybdenum-tantalum (Mo-Ta) alloy, etc., especially the Mo-W alloy, can be suitably used for the second conductive layer. It is necessary only that the second conductive layer be thick enough to cover the first conductive layer and prevent a hillock or blister of the first conductive layer.

For more effective prevention of a hillock or blister of the first conductive layer, a third conductive layer may be interposed between the first and second conductive layers. In the case where the second conductive layer is formed of a molybdenum-tungsten alloy or molybdenum-tantalum alloy, the third conductive layer may be suitably formed of, e.g., molybdenum, a constituent element of the second conductive layer. Thus, a hillock or blister of the first conductive layer can be prevented, the adhesion between the first and second conductive layers can be improved, and the first conductive layer can be tapered taking advantage of the difference in etching rate. The third conductive layer may be designed so as to cover the entire first conductive layer or be disposed only on the principal surface of the first conductive layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a plan view schematically showing a part of an array substrate for an active-matrix liquid crystal display device with TFTs according to an embodiment of the present invention;

FIG. 2 is an enlarged plan view schematically showing a portion including one of the TFTs;

FIG. 3 is a sectional view taken along line III—III of FIG. 1;

FIG. 4 is a sectional view showing a TFT according to Comparative Example 1;

FIG. 5 is a graph showing the voltage-current characteristics of the TFTs according to the embodiment and Comparative Example 1;

FIG. 7 is a graph showing water content dependence, in which the axes of ordinate and abscissa represent the relative etching rate for molybdenum (Mo) and the water content (%) of a mixed acid, respectively;

FIG. 8 is a sectional view schematically showing an array substrate according to a modification of the invention; and FIG. 9 is a sectional view schematically showing an array substrate according to another modification of the invention.

DETAILED DESCRIPTION OF THE PREFERRED EMBODIMENT

Figure 6A:
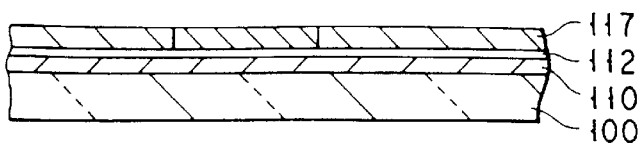
FIGS. 6A to 6F are sectional views for illustrating manufacturing processes for the array substrate according to the embodiment.

An active-matrix liquid crystal display device with thin-film transistors according to an embodiment of the present invention will now be described in detail with reference to the accompanying drawings.

As shown in FIGS. 1 and 3, the active-matrix liquid crystal display device comprises an array substrate 10 and an opposite substrate 12, which face each other with a given gap between them, and a liquid crystal layer 14 sealed between the substrates. The opposite substrate 12 includes a transparent glass substrate 20, and a transparent opposite electrode 22 is formed over the whole inner surface of the glass substrate. Further, a transparent orientation film 24 of polyimide or the like is formed on the opposite electrode 22.

Also, the array substrate 10 includes a transparent glass substrate 100, on which is formed a matrix consisting of 640×3 signal lines Xi (i=1, 2, ..., m, ..., 1920) and 480 gate lines Yj (j=1, 2, ..., n, ..., 480) extending substantially at right angles to the signal lines Xi. A transparent pixel electrode 181 of ITO (indium tin oxide) is disposed in each of the regions that are defined by the signal lines Xi and the gate lines Yj.

A TFT 171 of an inverted-staggered structure, having one of the gate lines Yj as its gate electrode, is arranged at the intersection of each signal line Xi and the gate line Yj. Also, 480 auxiliary capacitor lines Cj (j=1, 2, . . . , n, . . . , 480) are formed extending substantially parallel to the gate lines Yj. Each auxiliary capacitor line Cj and each of the pixel electrodes 181, which are formed on a gate insulating film 121 (see FIG. 3) on the glass substrate 100, constitute an auxiliary capacitor Cs. The gate lines Yj, signal lines Xi, TFTs 171, pixel electrodes 181, etc. are covered by an orientation film 30 of polyimide or the like.

Referring now to FIGS. 2 and 3, the TFT 171 will be described in detail. Each gate line Yj includes a first conductive layer 111 formed on the glass substrate 100, a third conductive layer 113 formed on the layer 111, and a second conductive layer 115 covering the first and third conductive layers. Each TFT 171 has a part of one of the gate lines Yj as its gate electrode.

The first conductive layer 111 is composed of a pure aluminum (Al) film having a line width (Lg1) of 6 μm, and is given a thickness of 200 nm so that the resistance of each gate line Yj can be lowered. The first conductive layer 111 may be formed of a metal or alloy based mainly on at least one of the materials selected from the group including aluminum, copper, and alpha tantalum (α-Ta). Preferably, the thickness of the first conductive layer 111 ranges from 100 to 300 nm.

Both side edge portions or side walls of the first conductive layer 111 are patterned so that they are inclined at an angle (θ1) of 20° to the glass substrate 100. The inclination angle (θ1) is set at a value smaller than 40°, and preferably from 10° to 30°.

The third conductive layer 113 on the first conductive layer 111 is formed of molybdenum (Mo), a constituent element of the second conductive layer 115. If the third conductive layer 113 has a thickness of 30 nm or more, it serves to enhance the adhesion between the first and second conductive layers 111 and 115 and lighten the stress. According to the present embodiment, therefore, the thickness of the third conductive layer 113 is adjusted to 50 nm.

The second conductive layer 115 is formed of a molybdenum-tungsten (Mo-W) alloy layer with a line width (Lg2) of 10 μm such that it fully covers the first and third conductive layers 111 and 113. Each side edge portion of the second layer 115 extends for 2 μm from its corresponding side edge of the first layer 111. Even if a mask is dislocated when the second conductive layer 115 is patterned, therefore, the second layer 115 can substantially fully cover the first and third layers 111 and 113.

The second conductive layer 115 may be formed of a metal or alloy based mainly on at least one of the materials selected from the group including tantalum, tungsten, and molybdenum, as well as the molybdenum-tungsten alloy.

The second conductive layer 115 has a thickness of 300 nm such that it can effectively prevent a hillock or blister of the first conductive layer 111 and the resistance can be fully lowered. Moreover, both side edge portions of side walls of the second conductive layer 115 are patterned so that they are inclined at an angle (θ2) of 30° to the glass substrate 100, in order to reduce insulation failure of the gate insulating film 121 that is attributable to the difference in level at the side edges.

In consideration of the prevention of insulation failure attributable to the difference in level at the side edges or a hillock or blister of the first conductive layer 111, it is advisable to adjust the thickness of the second conductive layer 115 to 200 to 400 nm. Also, the occurrence of insulation failure can be restrained by setting the inclination angle (θ2) at 45° or less. Preferably, the inclination angle (θ2) ranges from 20° to 45°.

Each gate line Yj constructed in this manner carries thereon the gate insulating film 121, which has a laminated structure composed of a silicon oxide ($SiO_2$) film and a silicon nitride ($SiN_x$) film. The insulating film 121 is overlain by a thin semiconductor film 131 or a-Si:H film.

Formed on the thin semiconductor film 131 is a channel protective film 141 or silicon nitride ($SiN_x$) film, which serves to protect the film 131 during channel formation. Arranged on the films 131 and 141 are a source electrode 161a and a drain electrode 161b, which are connected electrically to the thin semiconductor film 131 by through low-resistance semiconductor films 151a and 151b, respectively. The drain electrode 161b is integral with its corresponding signal line Xi. These elements constitute the TFT 171.

The channel protective film 141 is self-aligned with one of the gate lines Yj and patterned, in order to reduce effective overlapping regions between the gate line Yj and the source and drain electrodes 161a and 161b, that is, to reduce undesired parasitic capacities.

More specifically, the channel protective film 141 is patterned to an external dimension a little smaller than the width Lg2 of the gate line Yj. The distance (Lgd) between the drain-side end of the protective film 141 and its corresponding contour of the gate line Yj is set to be 1 μm or less, and so is the distance (Lgs) between the source-side end of the film 141 and its corresponding contour of the line Yj. The channel protective film 141, which is self-aligned with the gate line Yj, constitutes a channel region that is self-aligned with the gate line Yj.

In this TFT 171, as shown in FIG. 2, a region (hatched portion in FIG. 2) that is defined by a line (broken line P1 in FIG. 2) for electrical connection between the source electrode 161a and the thin semiconductor film 131 and a line (broken line P2 in FIG. 2) for electrical connection between the drain electrode 161b and the film 131 constitutes an effective channel region C. The contours or opposite side edges of the gate line Yj extend overlapping the channel region C, as viewed in a plane.

In the TFT 171 arranged in this manner, the inclination angle (θ1) of each side edge portion of the first conductive layer 111 is as narrow as 20°. Within the channel region C, therefore, the surface of the semiconductor film 131 on the side of the gate insulating film 121 constitutes an interface that is free from any substantial flexion.

When the profile of the TFT 171 was observed through a scanning electron microscope (SEM), the interface of the thin semiconductor film 131 on the side of the gate insulating film 121 within the channel region C was found to be a continuous smooth interface that contains no substantial bends, as shown in FIG. 3. Naturally, moreover, no insulation breakdown or cracks of the gate insulating film 121, attributable to the difference in level at the opposite side edges of each gate line Yj, were detected.

FIG. 4 shows a TFT 271 as Comparative Example 1 prepared in the same manner as in the foregoing embodiment except that the inclination angle (θ1) of the first conductive layer 111 is 35°. According to this TFT 271, although the gate insulating film 121 was free from insulation breakdown that is attributable to the difference in level at the end portions of each gate line Yj, the interface of the thin semiconductor film 131 on the side of the insulating film 121 within the channel region C was found to be an irregular interface containing substantial bends (Q1, Q2).

As Comparative Example 2, moreover, a TFT (not shown) was prepared in the same manner as in the foregoing embodiment except that the inclination angle (θ1) of the first conductive layer is 40°. In this case, as in the case of Comparative Example 1, although the gate insulating film was free from insulation breakdown that is attributable to the difference in level at the end portions of each gate line Yj, the interface of the thin semiconductor film on the side of the insulating film within the channel region was found to be an irregular interface containing substantial bends.

A measurement revealed that the mobility of the TFT 171 of the embodiment is 25% higher than that of the TFT 271 of Comparative Example 1.

FIG. 5 shows the voltage-current (V-I) characteristics of the TFTs. In FIG. 5, curves (a) and (b) represent the characteristics of the TFT 171 of the present embodiment and the TFT 271 of Comparative Example 1, respectively. As seen from FIG. 5, the TFT 171 of the embodiment is lower in threshold voltage (Vth) than the TFT 271 of Comparative Example 1.

Referring now to FIGS. 6A to 6F, manufacturing processes for the array substrate 10 with the aforementioned construction will be described in brief.

First, aluminum (Al) and molybdenum (Mo) are deposited in succession to layer thicknesses of 200 nm and 50 nm, respectively, on a principal surface of the glass substrate 100 by sputtering, whereupon an Al film 110 and an Mo film 112 are formed laminated, as shown in FIG. 6A. Thereafter, a photoresist 117 is applied to the resulting structure, exposed to acquire a desired shape, and developed.

Figure 6B:
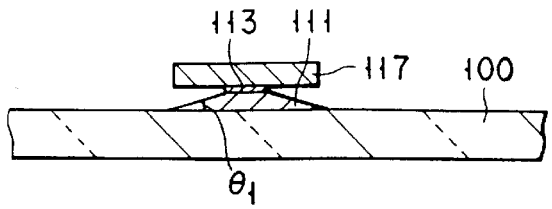

With use of the photoresist 117 as a mask, the Al film 110 and the Mo film 112 are dipped into a mixture of phosphoric acid, nitric acid, acetic acid, and water, as an etching solution. By doing this, the first conductive layer 111 of aluminum (Al), having its side edge portions inclined at an angle (θ1) of 20°, and the third conductive layer 113 of molybdenum (Mo) on the first layer 111 are formed, as shown in FIG. 6B. Control of the concentration of the etching solution is essential to the regulation of the inclination angle (θ1). Since the etching solution contains volatiles, its concentration changes during use. The relative etching rate for molybdenum, in particular, is considerably influenced by the water content (%) of the mixed acid, as shown in FIG. 7, and the inclination angle (θ1) is settled depending on the etching rate. It is essential, therefore, to control the relative etching rate for molybdenum.

Figure 6C:
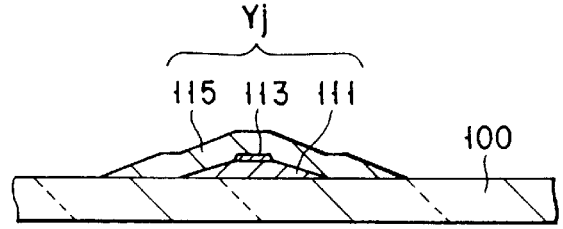

Thereafter, the photoresist 117 is peeled off, and a molybdenum-tungsten (Mo-W) alloy is deposited to a thickness of 300 nm by sputtering so as to cover the first and third conductive layers 111 and 113. Then, a photoresist is applied to the molybdenum-tungsten alloy film, exposed, and developed, and the molybdenum-tungsten alloy film is patterned, with use of the photoresist as a mask, by chemical dry etching (CDE) using an etching gas consisting mainly of carbon tetrafluoride ($CF_4$). Thereafter, the photoresist is peeled off, whereupon the second conductive layer 115 shown in FIG. 6C is obtained.

In this manner, the three-layer gate lines Yj are manufactured together with the auxiliary capacitor lines Cj (not shown).

Figure 6D:
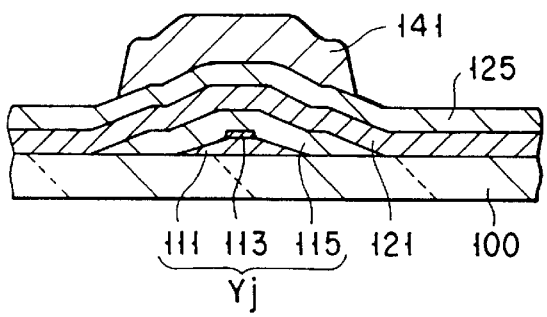
Figure 6E:
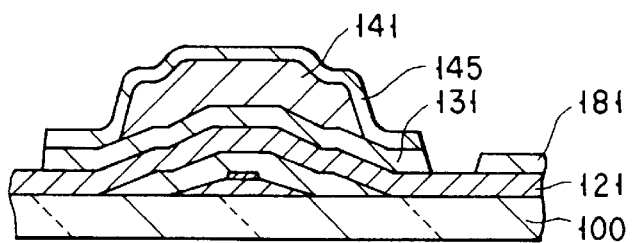

Subsequently, the silicon oxide ($SiO_2$) film is deposited on the gate lines Yj and the auxiliary capacitor lines Cj. Thereafter, the glass substrate 100 is set in a reaction furnace of a CVD apparatus (not shown), and reaction gases, including silane ($SiH_4$) at a flow rate of 200 sccm, ammonia ($NH_3$) at a flow rate of 1,000 sccm, and nitrogen ($N_2$) at a flow rate of 7,000 sccm, are introduced into the furnace. At the same time, the pressure in the reaction furnace is kept at 1 Torr, and the temperature of the glass substrate is increased to 339°. Then, a high-frequency voltage of 1,300 W is supplied to subject the silane and ammonia to plasma excitation, and silicon nitride ($SiN_x$) is deposited to a layer thickness of 50 nm on the silicon oxide film. Thereupon, the gate insulating film 121 formed of the silicon oxide film and the silicon nitride is obtained, as shown in FIG. 6D.

Further, the reaction gases are replaced with silane ($SiH_4$) at a flow rate of 400 sccm and hydrogen ($H_2$) at a flow rate of 1,400 sccm, and the new gases are introduced into the reaction furnace. Then, a high-frequency voltage of 150 W is supplied, and a thin a-Si:H film 125 is deposited to a layer thickness of 50 nm on the gate insulating film 121, as shown in FIG. 6D. Also in depositing the a-Si:H film 125, the pressure in the reaction furnace is kept at 1 Torr.

The 200-sccm silane ($SiH_4$) and 1,000-sccm ammonia ($NH_3$), for use as the reaction gases, and the 7,000-sccm nitrogen ($N_2$), as a carrier gas, are introduced again into the reaction furnace, the high-frequency voltage of 1,300 W is supplied, and silicon nitride ($SiN_x$) is deposited to a layer thickness of 300 nm on the thin a-Si:H film 125. Also in depositing the silicon nitride film, the pressure in the reaction furnace is kept at 1 Torr.

Thereafter, the glass substrate 100 is taken out of the reaction furnace, and a photoresist is applied to the silicon nitride film. The photoresist is exposed to light from under the glass substrate 100 and developed in a manner such that it is self-aligned with the gate line Yj. Then, the channel protective film 141 shown in FIG. 6D is obtained by patterning the silicon nitride with use of this photoresist as a mask.

After a thin $n^+$a-Si:H film is then deposited on the thin a-Si:H film 125 and the channel protective film 141 by means of the CVD apparatus, the a-Si:H film 125 and the $n^+$a-Si:H film are patterned into an insular configuration, whereupon the thin semiconductor film 131 and an insular $n^+$a-Si:H film 145 are formed. Thereafter, ITO is deposited on the glass substrate 100 by sputtering, and the resulting film is patterned into a given configuration, whereupon the pixel electrode 181 is formed having a substantially rectangular shape.

Figure 6F:
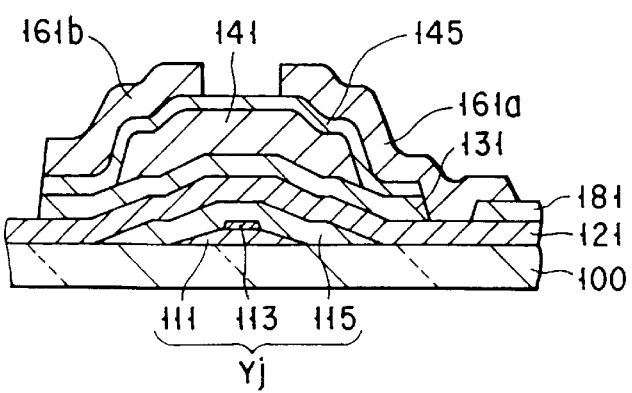

Subsequently, aluminum (Al) is deposited on the glass substrate 100 by sputtering, and the resulting film is patterned into a desired configuration, whereupon the source and drain electrodes 161a and 161b are formed, as shown in FIG. 6F.

Further, the insular $n^+$a-Si:H film 145 on the channel protective film 141 is patterned with use of the source and drain electrodes 161a and 161b as masks, whereupon the low-resistance semiconductor films 151a and 151b shown in FIG. 2 are formed. Thus, the array substrate 10 for the active-matrix liquid crystal display device, having a large number of TFTs 171 arranged therein, is manufactured.

In the liquid crystal display device according to the present embodiment arranged in this manner, each gate line Yj of the array substrate 10 includes the first conductive layer 111 that is formed of aluminum, so that its resistance can be fully lowered. In each gate line Yj, moreover, the first conductive layer 111, formed of aluminum, is fully covered by the second conductive layer 115 with the third conductive layer 113 interposed between them, so that it can be securely prevented from suffering a hillock or blister. Thus, lowering of the yield of production can be prevented.

Since each side edge portion of the first conductive layer 111 is inclined at an angle of 10° to 30°, moreover, the interface of the thin semiconductor film 131 on the side of the gate insulating film 121 can be formed as a smooth interface without any substantial bends in the channel region C. Accordingly, the resulting TFT 171 can enjoy excellent element characteristics such as high mobility, low threshold voltage (Vth), etc.

According to the TFT 171 of the embodiment described above, the channel protective film 141 is formed on the thin semiconductor film 131 in a manner such that it is self-aligned with the gate line Yj, so that the channel region C is also self-aligned with the line Yj. Thus, the parasitic capacities, such as the gate-source capacitor (Cgs), gate-drain capacitor (Cgd), etc., can be reduced.

It is to be understood that the present invention is not limited to the embodiment described above, and that various changes and modifications may be effected therein by one skilled in the art without departing from the scope or spirit of the invention. In the description to follow, like reference numerals are used to designate like portions throughout the drawings for simplicity of illustration, and a detailed description of those portions is omitted.

According to a modification shown in FIG. 8, for example, a TFT 171 dispenses with the channel protective film that is used in the foregoing embodiment. Except for this feature, the modification is arranged in the same manner as the embodiment described above. In the TFT constructed in this manner, the parasitic capacities, such as the gate-source capacitor (Cgs), gate-drain capacitor (Cgd), etc., are larger than those of the TFT according to the foregoing embodiment. This modification has advantages in requiring less manufacturing processes and entailing lower manufacturing cost, as well as in providing the same effects of the foregoing embodiment.

According to a TFT 171 shown in FIG. 9, moreover, low-resistance semiconductor films are not deposited individually, and are formed of a part of a thin semiconductor film 131. More specifically, a channel region 131a, source region 131b, and drain region 131c are formed in the semiconductor film 131 by doping the film 131 with impurity ions with use of a channel protective film 141, which is self-aligned with each gate line Yj, as a mask.

According to the TFT 171 constructed in this manner, the channel region is also self-aligned indirectly with each gate line Yj, so that the parasitic capacities, such as the gate-source capacitor (Cgs), gate-drain capacitor (Cgd), etc., can be reduced. Besides, the necessity of the process for depositing the low-resistance semiconductor films can be obviated, and the manufacturing cost can be lowered, as compared with the TFT 171 according to the foregoing embodiment. The other effects of the embodiment can be also secured.

It is to be understood that p-Si or microcrystalline silicon may be used in place of a-Si:H for the thin semiconductor film according to the embodiment and modifications described herein.

What is claimed is:

1. A thin-film transistor comprising:
    a gate electrode including a first conductive layer formed on a substrate and a second conductive layer covering the first conductive layer;
    a gate insulating film formed on the substrate and covering the gate electrode;
    a thin non-single-crystal silicon film disposed on the gate insulating film on the gate electrode and including a channel region; and
    a source electrode and a drain electrode connected electrically to the thin non-single-crystal silicon film,
    wherein the thin non-single-crystal silicon film has a continuous interface without bends, situated on the side of the gate insulating film in the channel region, and
    wherein said first conductive layer of said gate electrode has two opposite side edge portions extending inclined at an angle to the surface of the substrate, the inclination angle of each of the side edge portions ranging from 10° to 30°.

2. A thin-film transistor according to claim 1, wherein said second conductive layer of said gate electrode has two opposite side edge portions extending inclined at an angle to the surface of the substrate and along the opposite side edge portions of the first conductive layer, the inclination angle of each of said side edge portions of the second conductive layer ranging from 20° to 45°.

3. A thin-film transistor according to claim 1, wherein said first conductive layer is formed of a metal or alloy based mainly on at least one of the materials selected from the group consisting of Al, Cu, and α-Ta.

4. A thin-film transistor according to claim 1, wherein said second conductive layer is formed of a metal or alloy based mainly on at least one of the materials selected from the group consisting of Ta, W, and Mo.

5. A thin-film transistor according to claim 1, wherein said channel region is self-aligned with the gate electrode.

6. A thin-film transistor according to claim 1, wherein said first conductive layer has contours extending overlap the channel region as viewed in a plane.

7. A liquid crystal display device comprising:
    an array substrate and an opposite substrate facing each other across a given gap; and
    a liquid crystal layer sealed between the array substrate and the opposite substrate,
    the array substrate including a glass substrate, a plurality of gate lines formed on a principal surface of the glass substrate and extending parallel to one another, a plurality of signal lines arranged on the principal surface of the glass substrate and extending parallel to one another and substantially at right angles to the gate lines, pixel electrodes arranged individually in regions defined by the gate lines and the signal lines, and thin-film transistors provided individually at the intersections of the gate lines and the signal lines,
    each of the thin-film transistors including a gate electrode composed of a part of one of the gate lines and including a first conductive layer formed on the glass substrate and a second conductive layer covering the first conductive layer, a gate insulating film formed on the glass substrate and covering the gate electrode, a thin non-single-crystal silicon film disposed on the gate insulating film on the gate electrode and including a channel region, and a source electrode and a drain electrode connected electrically to the thin non-single-crystal silicon film, the thin non-single-crystal silicon film having a continuous interface without bends, situated on the side of the gate insulating film in the channel region, and
    wherein said first conductive layer of the gate electrode has two opposite side edge portions extending inclined at an angle to the surface of the glass substrate, the inclination angle of each of said side edge portions ranging from 10° to 30°.

8. A liquid crystal display device comprising:
    an array substrate and an opposite substrate facing each other across a given gap; and
    a liquid crystal layer sealed between the array substrate and the opposite substrate, the array substrate including a glass substrate, a plurality of gate lines formed on a principal surface of the glass substrate and extending parallel to one another, a plurality of signal lines arranged on the principal surface of the glass substrate and extending parallel to one another and substantially at right angles to the gate lines, pixel electrodes arranged individually in regions defined by the gate lines and the signal lines, and thin-film transistors provided individually at the intersections of the gate lines and the signal lines, each of the thin-film transistors including a gate electrode composed of a part of one of the gate lines and including a first conductive layer formed on the glass substrate and a second conductive layer covering the first conductive layer, a gate insulating film formed on the glass substrate and covering the gate electrode, a thin non-single-crystal silicon film disposed on the gate insulating film on the gate electrode and including a channel region, and a source electrode and a drain electrode connected electrically to the thin non-single-crystal silicon film, the thin non-single-crystal silicon film having a continuous interface without bends, situated on the side of the gate insulating film in the channel region, and wherein said second conductive layer of said gate electrode has two opposite side edge portions extending inclined at an angle to the surface of the glass substrate and along the opposite side edge portions of the first conductive layer, the inclination angle of each of said side edge portions of the second conductive layer ranging from 20° to 45°.

9. A liquid crystal display device according to claim 8, wherein said first conductive layer of said gate electrode has two opposite side edge portions extending inclined at an angle to the surface of the substrate and along the opposite side edge portions of the second conductive layer, the inclination angle of each of the side edge portions of the first conductive layer ranging from 10° to 30°.

10. A thin-film transistor comprising:

a gate electrode including a first conductive layer formed on a substrate and a second conductive layer covering the first conductive layer and having two opposite side edge portions extending inclined at an angle to the surface of the substrate, the inclination angle of each of said side edge portions ranging from 20° to 45°;

a gate insulating film formed on the substrate and covering the gate electrode;

a thin non-single-crystal silicon film disposed on the gate insulating film on the gate electrode and including a channel region; and a source electrode and a drain electrode connected electrically to the thin non-single-crystal silicon film, wherein the thin non-single-crystal silicon film has a continuous interface without bends, situated on the side of the gate insulating film in the channel region.

* * * * *